United States Patent [19]

Kayanuma et al.

[11] Patent Number: 4,584,055
[45] Date of Patent: Apr. 22, 1986

[54] METHOD FOR MANUFACTURING A SEMICONDUCTOR DEVICE

[75] Inventors: Akio Kayanuma, Odawara; Minoru Nakamura, Zama; Katsuaki Asano, Ebina, all of Japan

[73] Assignee: Sony Corporation, Tokyo, Japan

[21] Appl. No.: 717,173

[22] PCT Filed: Jul. 19, 1984

[86] PCT No.: PCT/JP84/00367
§ 371 Date: Mar. 19, 1985
§ 102(e) Date: Mar. 19, 1985

[87] PCT Pub. No.: WO85/00695
PCT Pub. Date: Feb. 14, 1985

[30] Foreign Application Priority Data

Jul. 19, 1983 [JP] Japan .................. 58-132349

[51] Int. Cl.[4] ............ H01L 21/306; B44C 1/22; C03C 15/00; C03C 25/06
[52] U.S. Cl. ................... 156/628; 29/576 B; 29/580; 156/643; 156/646; 156/647; 156/651; 156/657; 156/662; 252/79.5; 357/34

[58] Field of Search .............. 252/79.1, 79.5; 156/628, 643, 646, 647, 651, 657, 659.1, 662; 148/1.5, 187; 204/192 E; 29/576 B, 580; 357/34

[56] References Cited

U.S. PATENT DOCUMENTS 4,433,470 2/1984 Kaneyama et al. ........... 156/628 X
4,481,706 11/1984 Roche ....................... 156/628 X
4,522,682 6/1985 Soclof ........................ 156/651 X Primary Examiner—William A. Powell
Attorney, Agent, or Firm—Hill, Van Santen, Steadman & Simpson

[57] ABSTRACT

Utilizing the fact that an isotropic etching rate of a semiconductor layer such as a polycrystalline or amorphous silicon layer depends on a doped amount of an impurity doped into the semiconductor layer, the impurity is doped into a semiconductor layer (26) formed on a substrate (4) so as to have a concentration distribution in its thickness direction. Then, in a region of the semiconductor layer (26) to be selectively removed, an anisotropic etching is carried out such that a portion of high impurity concentration is removed and a portion thereof in the thickness direction is remained. Thereafter, the remained portion is subjected to an isotropic etching to thereby suppress the side etching.

2 Claims, 26 Drawing Figures

METHOD FOR MANUFACTURING A SEMICONDUCTOR DEVICE

DESCRIPTION

1. Technical Field

This invention relates to a method for manufacturing various kinds of discrete semiconductor devices or a semiconductor device such as a semiconductor integrated circuit device and so on.

2. Background Art

Upon manufacturing various kinds of semiconductor devices, there is frequently employed such a process for selectively etching a semiconductor layer such as a polycrystalline semiconductor layer or amorphous semiconductor layer.

With reference to FIGS. 1 to 9, an example of a prior art method for manufacturing a semiconductor device by forming a polycrystalline silicon semiconductor layer on a silicon substrate and then selectively etching the same will be described. In this example, an NPN-type bipolar transistor is obtained.

At first, as shown in FIG. 1, there is prepared a P-type single crystalline silicon substrate 1 and an N-type buried region 2 is formed on a main surface 1a thereof by a selective diffusion process or the like.

As shown in FIG. 2, an N-type silicon semiconductor layer 3 is epitaxially grown on the whole of the main surface 1a of the substrate 1 to thereby form a single crystalline silicon substrate 4.

As shown in FIG. 3, a thick oxide insulating layer 5 is formed in the silicon semiconductor layer 3 of the substrate 4 by a selective-thermal-oxidizing the same except portions 3a and 3b in which an emitter or base region and a collector deriving electrode are to be formed respectively on the buried layer 2.

As shown in FIG. 4, on the semiconductor layer 3 including the oxide insulating layer 5, there is thoroughly formed a P-type impurity, for example, boron B doped polycrystalline silicon semiconductor layer 6 by a chemical vapor deposition method (CVD method) and this polycrystalline silicon semiconductor layer is patterned by selectively etching other portions except the portions which will finally become a base electrode derive region and a base electrode, for example. Then, on the whole surface including the polycrystalline silicon semiconductor layer 6, there is formed an oxide mask layer 7 of an $SiO_2$ similarly by, for example, the CVD method.

As shown in FIG. 5, the photolithography is carried out for the mask layer 7 to selectively form a window 7a through a part thereof on the portion 3a of the semiconductor layer 3, particularly a portion on which the emitter region will be formed finally and the polycrystalline silicon layer 6 is selectively etched out through the window 7a so as to form a window 6a therethrough corresponding to the window 7a.

As shown in FIG. 6, using the polycrystalline silicon layer 6 and the mask layer 7 thereon as a mask, a P-type impurity-doped region 8 is formed by selectively ion-implanting a P-type impurity, for example, boron B into the portion 3a of the semiconductor layer 3 through the windows 7a and 6a.

As shown in FIG. 7, an $SiO_2$ oxide insulating layer 9 is formed thoroughly on the mask layer including the region 8 so as to close the window 7a by the CVD method or the like. Further, the ion-implanted region 8 is activated by the annealing so as to become a base region, and a high concentration region 8a for use in deriving the base electrode is formed, for example, around the base region 8 by diffusing the impurities to the portion 3a from the impurity-doped polycrystalline silicon layer 6 deposited directly on the portion 3a.

As shown in FIG. 8, a window 9a is formed through a part of the region 8 by the photolithography of the oxide insulating layer 9 and a window 10 is formed on the other portion 3b of the semiconductor layer 3 by selectively etching the oxide insulating layer 9 and the mask layer 7 formed beneath the oxide insulating layer so as to expose the portion 3b to the outside. Then, an emitter region 11 and a low resistance region 12 for use in deriving a collector electrode are respectively formed by, for example, ion-implanting N-type impurity through these windows 9a and 10.

As shown in FIG. 9, a window 13 is formed on a part of the polycrystalline silicon layer 6 contacting with the base electrode deriving region 8a so as to expose the polycrystalline silicon layer, and through the windows 9a, 10 and 13, there are respectively formed metal electrodes, for example, aluminium electrodes of an emitter electrode 14, a collector electrode 15 and a base electrode 16. In this case, a thin silicon polycrystalline layer 17 is formed by the CVD method, if necessary.

As described above, an NPN-type bipolar transistor is formed in the substrate 4 in which on the low resistance buried region 2, a part 18 of the portion 3a of the semiconductor layer 3 is made as the collector region the base region 8 is formed thereon and the emitter region 11 are formed thereon.

According to the method for manufacturing the bipolar transistor as mentioned above, since the base electrode deriving region 8a of the base region 8 is formed by diffusing the impurities from the polycrystalline silicon semiconductor layer 6 which directly contact with the portion 3a of the semiconductor layer 3 and forms a part of the base electrode, a positional relation between the region 8a and the polycrystalline silicon layer 6 as the base electrode can be determined automatically, or they can be self-aligned. As a result, it is easy to derive the base electrode from the narrow surface portion of the base region.

However, in the case of being accompanied with the selective etching process like the above method for manufacturing the semiconductor device as mentioned above, there arise various problems. These problems will be described with reference to FIG. 10. FIG. 10 is an enlarged cross-sectional view illustrating a main part of FIG. 7 under the state that the oxide insulating layer 9 is removed therefrom. In FIG. 10, like parts corresponding to those of FIG. 7 are marked with the same references. The first example is: When the polycrystalline silicon layer 6 is etched by a normal wet etching process, its etching rate has an isotropic property so that the etching window 6a of the polycrystalline layer becomes large in size as compared with the window 7a of the oxide mask layer 7, or a so-called side etching occurs so that the etching window spreads into the under peripheral edge of the window 7a. As a result, when the region 8a is formed by diffusing the impurity of the polycrystalline silicon layer 6 to the semiconductor layer 3, a gap g is produced between this region 8a and the inherent central base region 8 and hence both of them are not communicated with each other.

The second problem is: When the previously impurity-doped polycrystalline silicon layer is used, if in the semiconductor integrated circuit a resistance element is formed by the other portion of the polycrystalline silicon layer, this portion is used also as the base electrode so that it is formed to have a low resistivity. As a result, in the portion which is used as the resistance element, the pattern thereof is formed as a fine pattern and the length of the resistance element is increased so that the high or large integrated scale of the integrated circuit is lowered.

The third problem is: Since the surface of the polycrystalline silicon layer 6 takes the form of concavity and convexity due to its particle, when the selective etching is carried out through the window 7a of the oxide layer 7 formed on this polycrystalline silicon layer, if the depth of the etching is confined to the surface of the semiconductor layer 3, a concave and convex surface 19 which inherits the concavity and convexity of the surface of the polycrystalline silicon layer 6 is formed. When such concave and convex surface 19 is formed, also the under surface of the base region 8 formed by the ion-implantation from the surface 19 takes the form of concavity and convexity so that if the emitter region 11 is formed on this base region as described in connection with FIG. 8, the base width, or the distance between the emitter and the collector becomes irregular. Thus, there occur accidents such as a so-called punch-through and so on, and in addition a stable characteristic can not be obtained because of the unstable concave and convex surface and the characteristic thereof has poor control property and reproducibility.

This invention is to provide a method for manufacturing a semiconductor device which can obviate the above-described defects.

In this invention, upon selectively etching a semiconductor layer such as a polycrystalline semiconductor layer or the amorphous semiconductor layer, the etching can be prevented from being spread in the lateral direction of the semiconductor layer, namely the side etching can be prevented substantially from being caused or the side etching can be controlled as is desired.

Further, in this invention, it is possible to form a polycrystalline layer of low resistivity as an electrode layer and a polycrystalline layer of high resistance such as a resistance element pattern and so on.

Furthermore, this invention relates to a manufacturing process of a semiconductor device accomapnied with a manufacturing process for selectively etching a semiconductor layer such as a polycrystalline semiconductor layer or an amorphous semiconductor layer as mentioned above, in which if necessary the substrate surface exposed by the etching can be formed as a smooth surface without selecting the depth of etching so large as to enter into the semiconductor substrate.

DISCLOSURE OF INVENTION

This invention adopts a selective etching method which uses a fact that an isotropic etching rate of a semiconductor layer such as a polycrystalline silicon layer or an amorphous silicon layer depends on the doped amount of impurity.

That is, this invention relates to a method of manufacturing a semiconductor device comprising the steps of doping an impurity into a semiconductor layer formed on a substrate having a concentration distribution in the thickness direction thereof and in the regions of the semiconductor layer which is selectively removed for removing a portion of high impurity concentration and for remaining a portion thereof in the thickness direction of the semiconductor layer by an anisotropy etching.

The isotropic etching to this semiconductor layer is carried out as follows: As the substrate having such semiconductor layer, such a substrate is prepared, in which the surface thereof, or the crystalline surface in its plane direction, in other words, the Miller indices thereof are determined previously. At the same time, as an etchant, there is prepared such an etchant which has a so-called crystallographic etching property for a semiconductor substrate, for example, silicon substrate or a dependency on the Miller indices of a single crystalline semiconductor. Then, the isotropic etching of the semiconductor layer can be carried out by using a difference of the etching rate between the substrate and the polycrystalline or amorphous semiconductor layer formed on the substrate.

In this case, when the substrate is a semiconductor discrete crystalline substrate, as the etchant having a large dependency of the etching rate relative to the Miller indices thereof, it is possible to use, for example, a KOH etchant or APW (amine, pyrocatechol and water) etchant. On the other hand, the major surface of the afore-said semiconductor substrate can be determined as a $\{111\}$ crystalline surface of Miller indices which is small in the etching rate relative to this etchant. Then, ion-implantation is carried out such that the peak of the impurity concentration may lie within the thickness of the semiconductor layer such as the polycrystalline semiconductor layer or the amorphous semiconductor layer formed on this semiconductor substrate. Thereafter, the anisotropic etching, for example, the dry etching is carried out so that a part of the polycrystalline semiconductor layer or the amorphous semiconductor layer in its thickness direction is left as it is. Then, the wet etching which has dependency on the etching rate relative to the above-mentioned Miller indices is carried out.

In some case, ion-implantation is carried out such that with respect to the thickness direction of the semiconductor layer formed on the semiconductor substrate having the Miller indices selected as mentioned above, the peak of the impurity concentration lies within a part thereof except the portion near the boundary surface between the semiconductor substrate and the semiconductor layer. Then, the portion at least including this ion-implanted peak portion is removed by the anisotropic etching, for example, the dry etching. Thereafter, by annealing the same, portions are formed which have substantially different doped amounts of impurity with respect to the surface direction of the polycrystalline semiconductor layer or the amorphous semiconductor layer. Then, the semiconductor layer is subjected to the wet-etching process which has the dependency of the etching rate relative to the Miller indices for the semiconductor substrate above mentioned and the property of isotropic etching for the semiconductor layer.

BEST MODE FOR CARRYING OUT THE INVENTION

Figure 11:
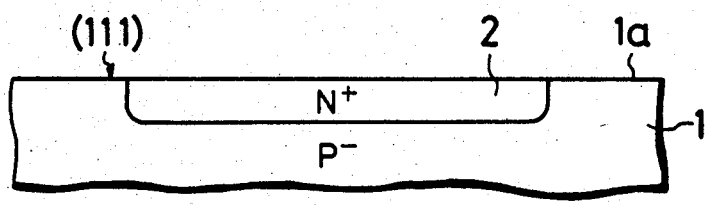
FIGS. 11 to 20 are respectively process diagrams showing an embodiment of a manufacturing method according to this invention.
Figure 12:
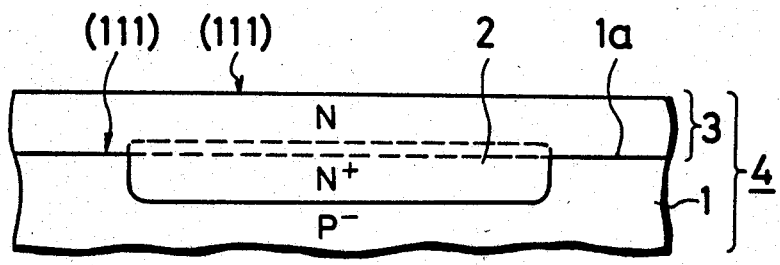
Figure 13:
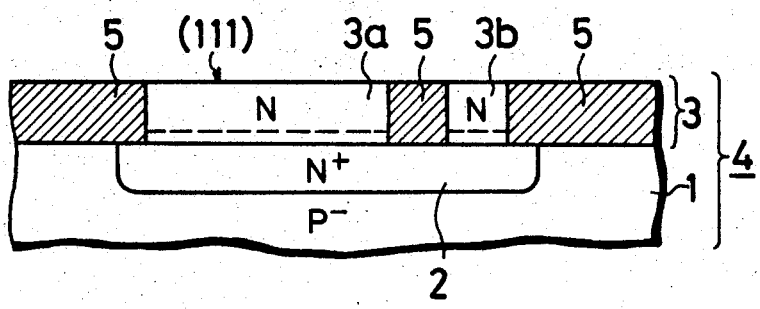

Referring initially to FIG. 11 and the followings, an embodiment of the method for manufacturing a semiconductor device according to this invention will be described in association with the similar NPN-type bipolar transistor which was previously explained in connection with FIGS. 1 to 9. In FIG. 11 and the followings, like parts corresponding to those of FIGS. 1 to 9 are marked with the same references. As shown in FIGS. 11 to 13, this invention takes the same processes as those of FIGS. 1 to 3. That is, also in this embodiment, the silicon semiconductor layer 3 is epitaxially grown on, for example, the silicon semiconductor substrate 1 of the single crystal to thereby form the silicon substrate 4. As the substrate 4, there can be used such one of which the surface direction has {111} crystalline surface. In other words, the major surface 1a of the substrate 1 shown in FIG. 11 is selected to be the {111} crystalline surface so that the surface direction of the silicon semiconductor layer to be formed thereon is to have the {111} crystalline surface.

Figure 14:
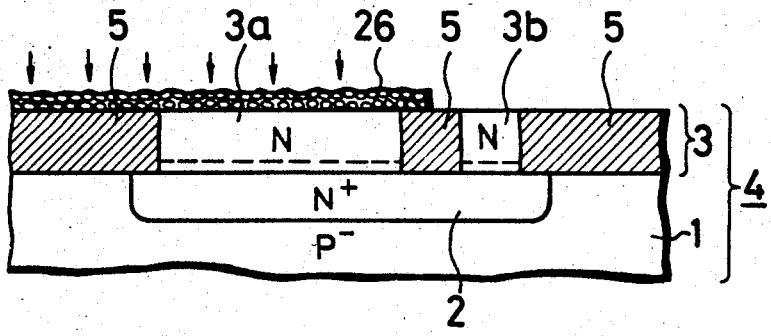

Then, as shown in FIG. 14, on the substrate 4 with the surface direction selected to be Miller indices {111}, there is formed, for example, a polycrystalline silicon layer 26 so as to have a thickness of, for example, 3000 Å CVD method. Particularly in this invention, when the polycrystalline silicon semiconductor layer 26 is formed, a polycrystalline silicon layer is initially formed with no impurity doped thereto and then impurity ion such as $B^+$, $BF_2^+$ or $As^+$ and so on are implanted into the predetermined portion thereof with a predetermined impurity concentration distribution.

In this case, the ion implantation to the polycrystalline silicon layer 26 is desired such that in order to prevent the concentration of the semiconductor layer 3 from being affected by the ion implantation as much as possible, the layer having the peak value of the impurity concentration distribution lies in the position distant from the boundary surface between the semiconductor layer 3 and the polycrystalline silicon layer, for example, the intermediate portion with respect to the thickness direction of the polycrystalline silicon layer 26 or the surface side thereof.

Figure 15:
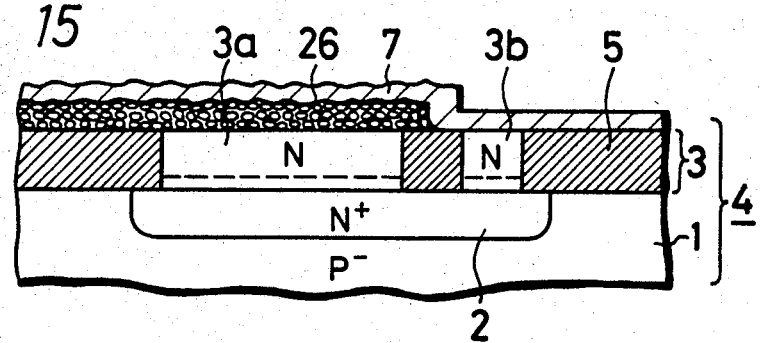

As shown in FIG. 15, the oxide mask layer 7 is formed similarly on the whole surface area of the semiconductor layer by, for example, the CVD method.

Figure 1:
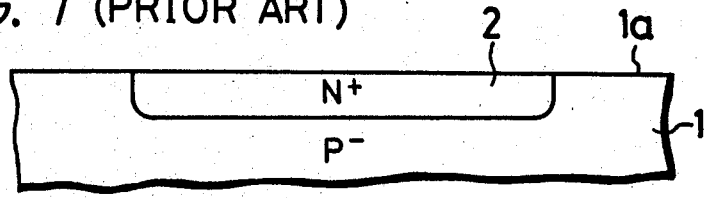
FIGS. 1 to 9 are respectively process diagrams useful for explaining a prior art method for manufacturing a semiconductor device.
Figure 2:
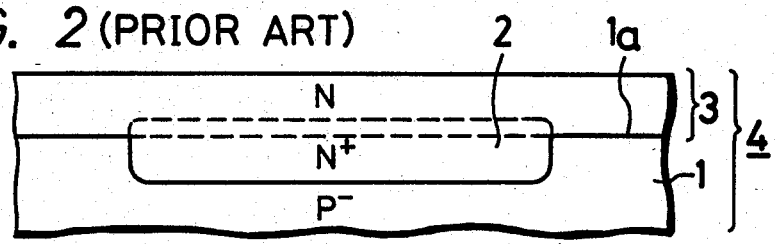
Figure 3:
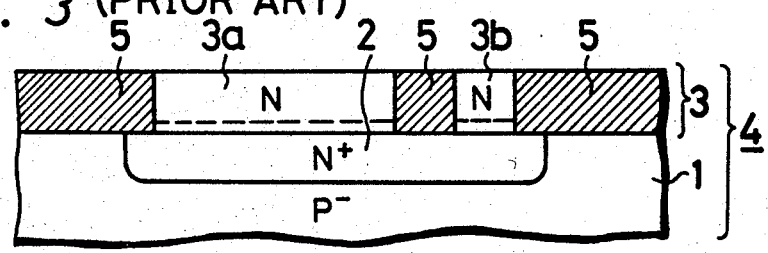
Figure 4:
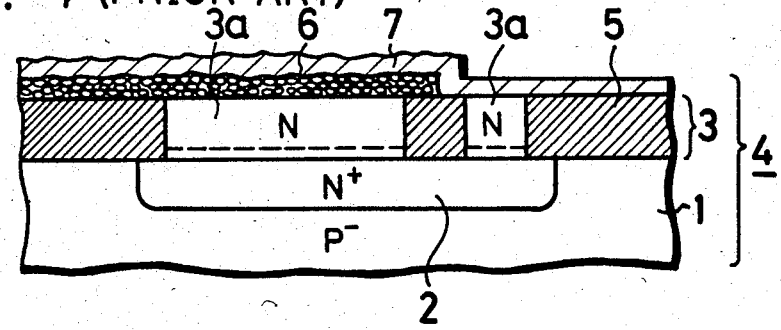
Figure 5:
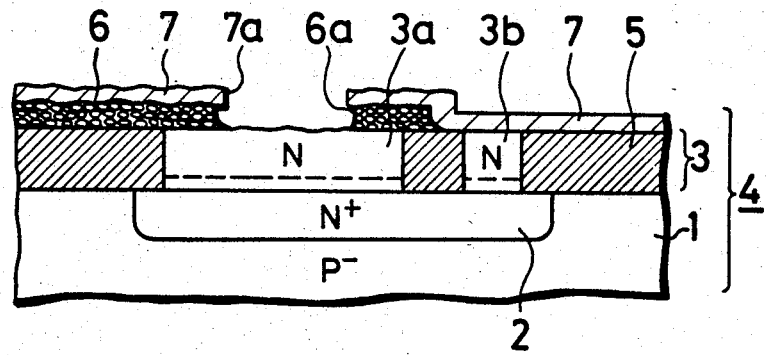
Figure 6:
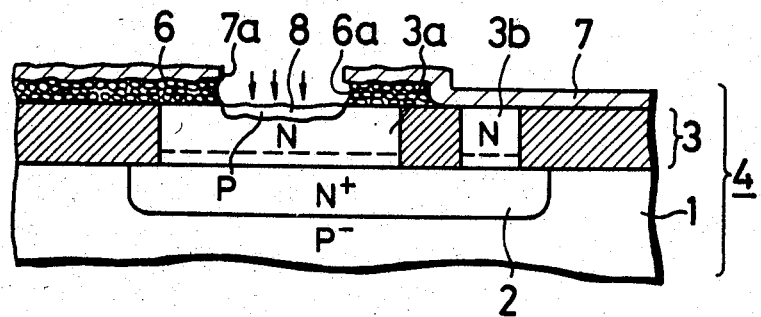
Figure 16:
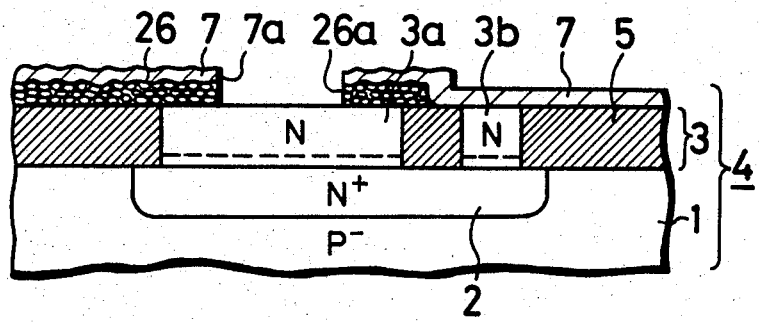

As shown in FIG. 16, the window 7a same as that of FIG. 5 is formed through the oxide mask layer 7 by, for example, photolithography and through this window 7a, the polycrystalline silicon layer 26 formed beneath the window is selectively etched to form a window 26a corresponding to the window 7a.

Figure 17:
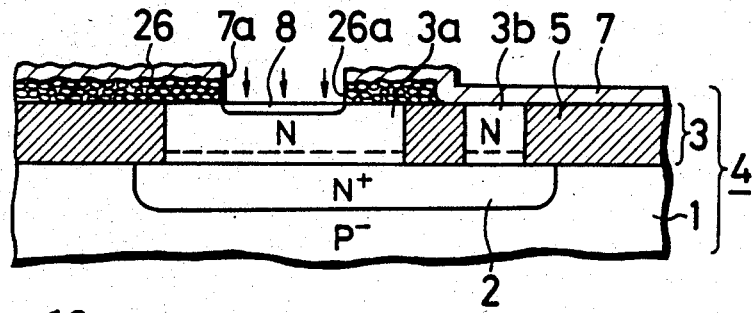

Then, as shown in FIG. 17, P-type impurity, for example, boron B is ion-implanted to the portion 3a of the semiconductor layer 3 exposed through the windows 7a and 26a to thereby form an ion-implanted region 8.

Figure 7:
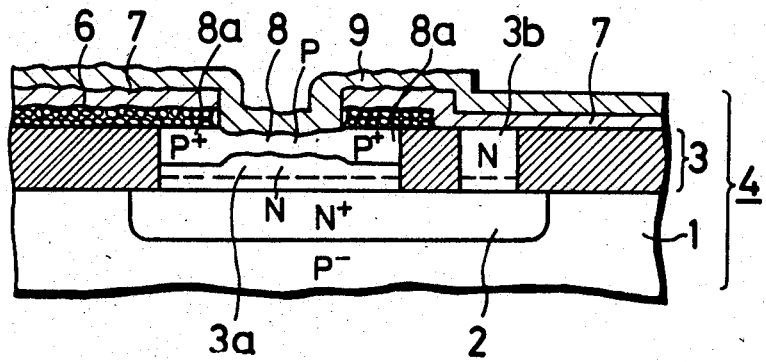
Figure 18:
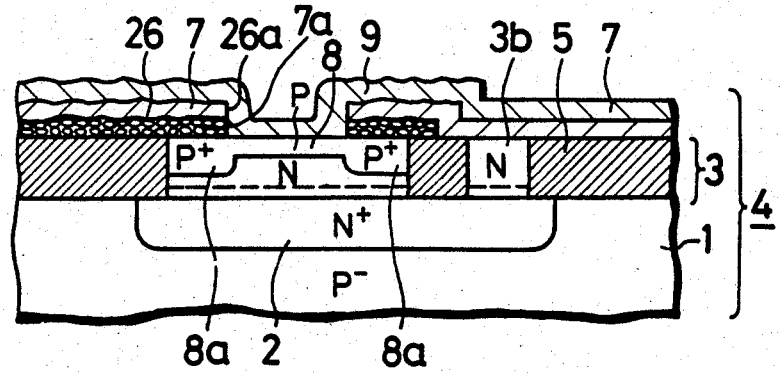

As shown in FIG. 18, the same oxide insulating layer 9 as that of FIG. 7 is formed, by annealing the same, the ion-implanted region 8 is activated so as to make the base region and P-type impurity from the polycrystalline silicon layer 26 is diffused, for example, to the peripheral portion of the base to thereby form the base electrode deriving region 8a.

Figure 8:
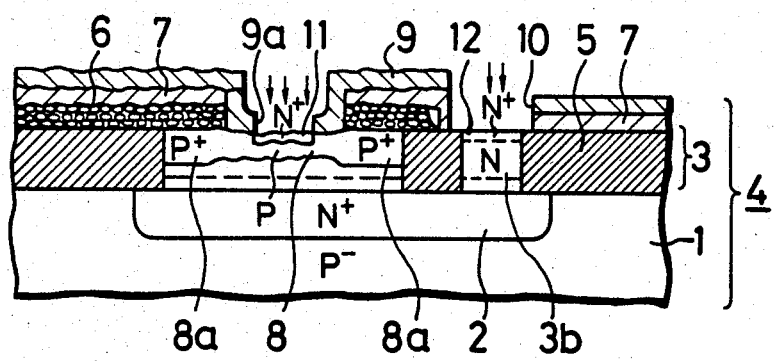
Figure 19:
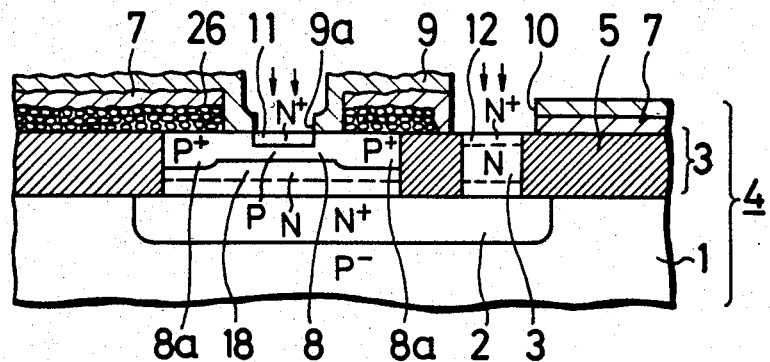

As shown in FIG. 19, similar to FIG. 8, the insulating layer 9 which is on the base region 8 in the portion 3a of the semiconductor layer 3 and the insulating layers 7 and 9 on the portion 3b are respectively etched by the photolithography to thereby form windows 9a and 10. Then, N-type impurity is ion-implanted through these windows so as to form the emitter region 11 and the collector electrode deriving region 12 of low resistivity, respectively.

Figure 20:
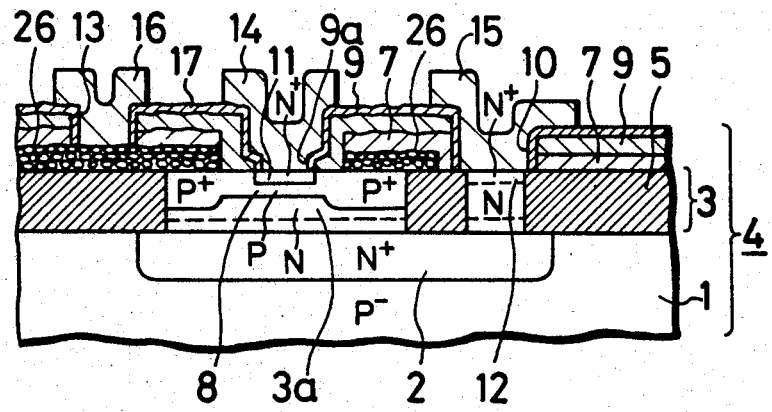

As shown in FIG. 20, a window 13 is formed through the mask layers 7 and 9 formed on a part of the polycrystalline silicon layer 26 by the photolithography which becomes the base electrode. The base electrode 16 is formed on this portion and the collector electrode 15 and the emitter electrode 14 are respectively deposited on the regions 12 and 11 in ohmic contact. These electrodes 14, 15 and 16 can respectively be formed as desired patterns by selectively etching aluminium electrodes and so on which were evaporated on the whole surface of the regions. Also in this case, the thin polycrystalline silicon layer 17 can be formed on the surfaces thereof by the CVD method and the like as required.

Figure 9:
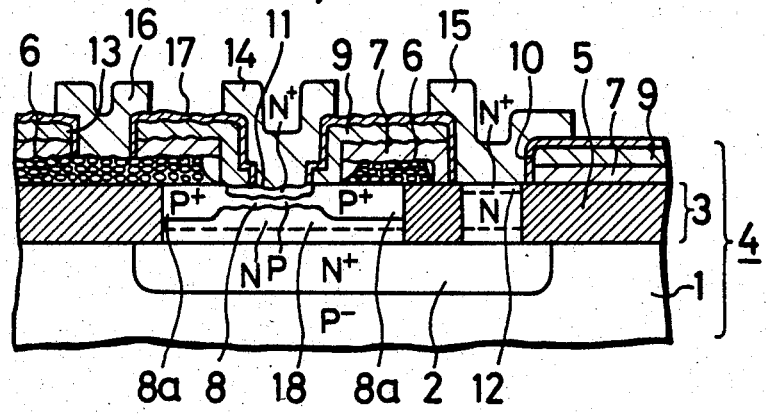
Figure 10:
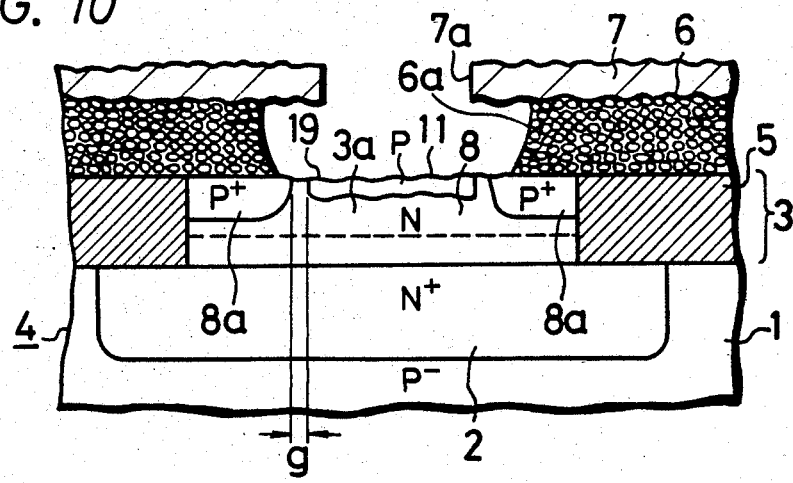
FIG. 10 is an enlarged cross-sectional view of a main part thereof used to explain the same.
Figure 21:
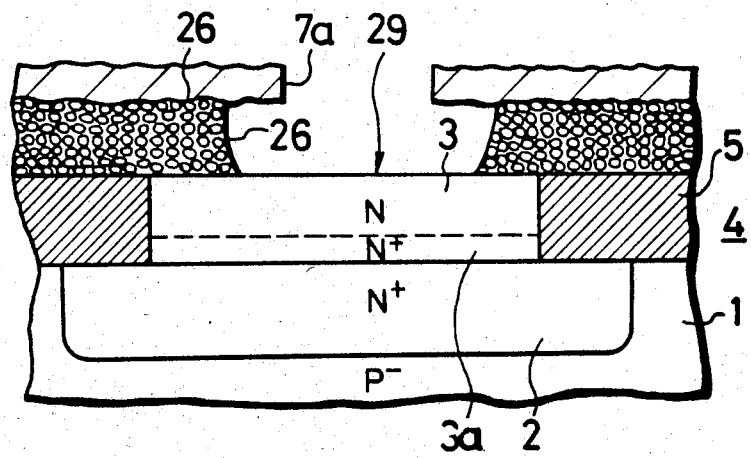
FIG. 21 is an enlarged cross-sectional view of a main part thereof used to explain the same.

As described above, it becomes possible to obtain the same NPN-type bipolar transistor as that of FIG. 9. Particularly in accordance with the manufacturing method of this invention, a special method is employed to form the window 26a through the polycrystalline silicon layer 26. That is, when the window 26a is formed through the polycrystalline silicon layer 26, the side etching which will enter into the under side of the peripheral edge of the window 7a of the mask layer 7 shown in FIG. 21 is not caused.

To this end, in the process for forming the window 26a as shown in FIG. 16, the polycrystalline silicon layer 26 is etched away by a combination of the dry etching process capable of the etching with directivity therefor, for example, a reactive ion etching (RIE) and the crystallographic wet etching having isotropy relative to the polycrystalline silicon layer 26.

Figure 22:
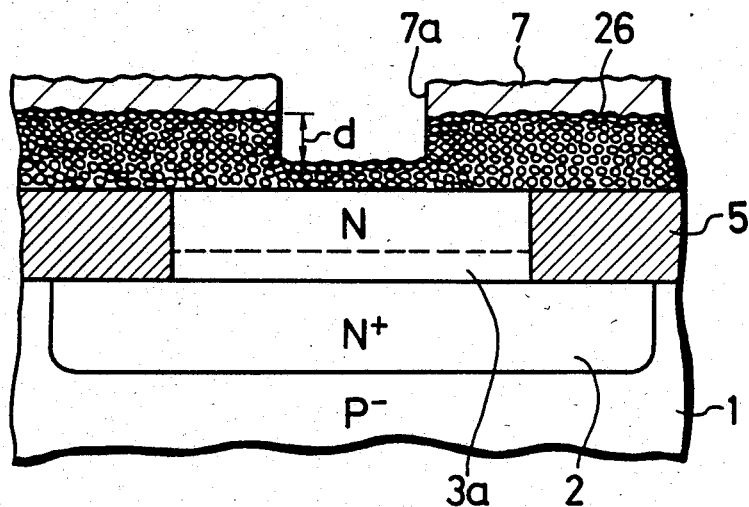
FIGS. 22 and 23 are respectively enlarged crosssectional views of a main part of another embodiment of the manufacturing method according to this invention, illustrating the manufacturing processes thereof.
Figure 23:
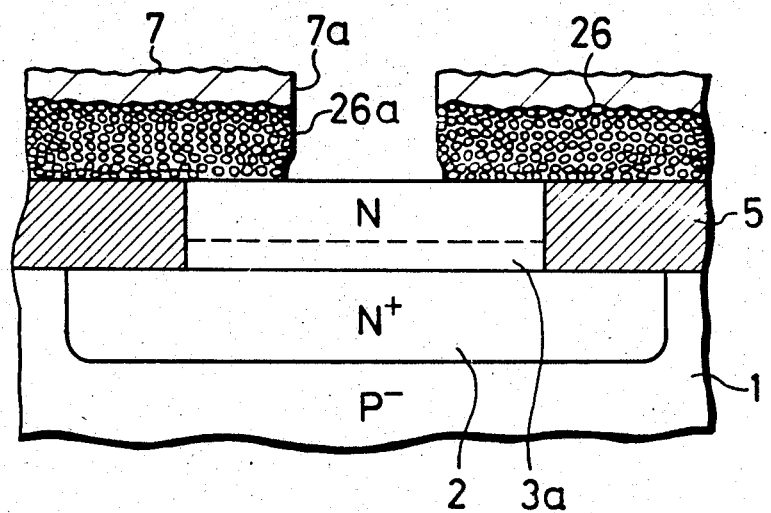

More particularly, as, for example, shown in FIG. 22, the polycrystalline silicon layer 26 is firstly etched through the window 7a by the dry etching of RIE so that the polycrystalline silicon layer 26 is etched away to a predetermined depth d with the thickness of its one part being remained. Thereafter, as shown in FIG. 23, the remaining thickness portion of the polycrystalline silicon layer 26 is etched through the window 7a by the isotropic wet etching based on the crystallographic etching and thus the window 26a is formed. This crystallographic etching uses an etchant having a dependency on the Miller indices of silicon, for example, KOH solution (aqueous solution with a mixing ratio of 250 g of KOH relative to 2000 cc of $H_2O$) or APW solution (solution formed by mixing 255 cc of ethylene diamine, $NH_2(CH_2)_2$, 45 g of pyrocatechol, $C_6H_4(OH)_2$ and 120 cc of $H_2O$). At this time, although the etching for the polycrystalline silicon layer 26 proceeds at relatively high speed, when the etching for the silicon proceeds until the {111} crystalline surface on the surface of the semiconductor layer 3 is exposed, the etching speed is rapidly lowered at that portion and hence the etching seems to be ceased apparently so that the etching treatment is ended at this time. Thus, the window 26a is formed with only the polycrystalline silicon layer 26 being removed by etching. At this time, the surface of the semiconductor layer 3 exposed within the window 26a is a smooth surface of {111} surface. That is, the etchant having a so-called crystallographic anisotropy such as the above-described KOH solution or APW solution and so on is such one that its etching rate for the {111} surface of the silicon single crystal is as low as about 1/1000 of the etching rate for the {100} surface. Accordingly, since the both crystalline surfaces, the {100} surface and the {111} surface exist simultaneously in the polycrystalline semiconductor layer, the etching on the polycrystalline silicon layer 26 proceeds dominantly in the {100} surface having high etching rate. As a result, the etching on the polycrystalline silicon layer 26 proceeds rapidly and since the {100} surface exists in the polycrystalline semiconductor layer in the isotropic manner, this etching has an isotropic property. When the etching reaches to the substrate 4 having the {111} surface, or the surface of the semiconductor layer 3, its etching rate is considerably lowered and thus the etching stops proceeding apparently at this time. Accordingly, if the etching treatment is ended at this time, only the polycrystalline silicon layer 26 is removed and thereby the surface of the semiconductor layer 3 having the smooth surface made of the {111} surface is exposed.

Consequently, since the bottom surfaces of the emitter region 11 and the base region 8 formed by the ion-implantation from the smooth surface of the portion 3a of the semiconductor layer 3 are respectively formed as the flat surfaces, the gap therebetween, or the base width can be obtained uniformly, stably and with good reproducibility. Further, since the emitter region 11 can be prevented from being punched through to the collector region due to the concavity and convexity of the surface, it is possible to obtain the transistor, or the semiconductor device of high reliability.

As noted above, according to this invention, the window 26a is bored through the polycrystalline semiconductor layer 26 by the combination of the anisotropic etching based on, for example, the RIE and the isotropic etching based on the crystallographic etching. In this case, since in the RIE dry etching, the etching can proceed with directivity, or the etching can proceed only in substantially the thickness direction of the polycrystalline semiconductor layer 26, if the most of the thickness d of the polycrystalline silicon layer 26 is processed by this RIE dry etching and the thickness of the remaining portion is processed by the wet etching, it is possible to minimize the occurrence of the side etching sufficiently.

Further, the occurrence of the side etching can be avoided by the combination of the dry etching and the wet etching based on the crystallographic etching as mentioned above. According to employing this method, it becomes possible to obviate a disadvantage of the etching process in a case where the concentration of impurity implanted into the polycrystalline silicon layer 26 is increased so as to afford a sufficiently low resistivity. To be more concrete, when an impurity ion such as $B^+$, $BF_2^+$, $As^+$, $P^+$, $Si^+$ and so on is ion-implanted into the polycrystalline silicon layer, the etching rate of the etching is extremely lowered in portion where the above ion is highly-doped. In this case, however, when the impurity ion is preliminarily doped into the polycrystalline silicon layer 26, if the peak of the concentration distribution of the impurity concentration lies at the intermediate portion remote from the boundary surface between the polycrystalline silicon layer 26 and the semiconductor layer 3 or at the surface side, in the afore-described dry etching, the etching proceeds to the portion in which the impurity ion is doped with a high concentration, for example, to the position lower than the depth exhibiting the peak value of the concentration. Then the wet etching can be carried out properly, as the impurity highly-doped portion is removed.

Accordingly, since enough impurities are doped into the remained polycrystalline silicon layer 26 which will become electrodes and a wiring element, the electrode deriving region 8a of low resistance can be formed by diffusing the impurities therefrom into the semiconductor layer 3 and further the remained polycrystalline silicon layer itself can become the electrode of low resistivity or the wiring element.

Figure 24:
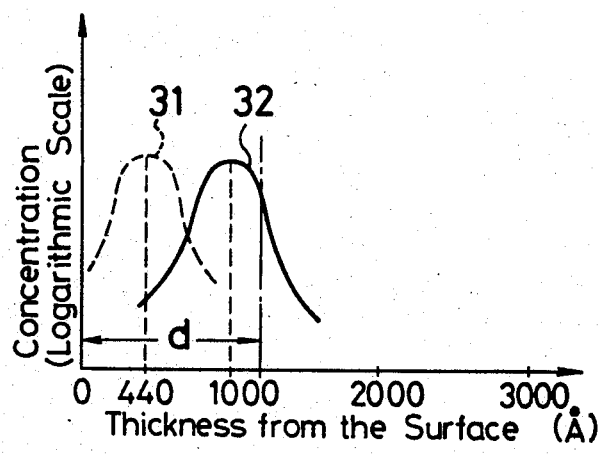
FIG. 24 is a graph of an impurity ion concentration distribution useful for explaining this invention.
Figure 25:
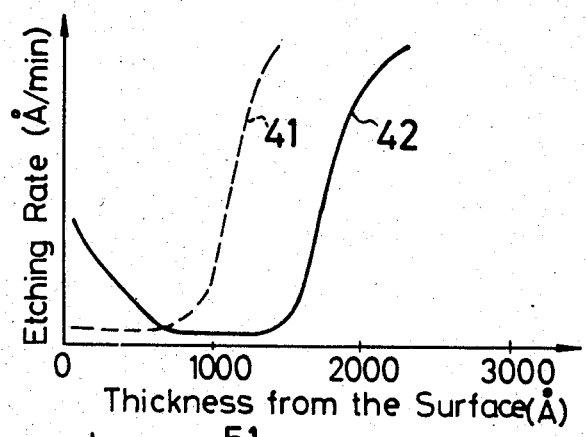
FIG. 25 is a graph showing a distribution of an etching rate corresponding to the impurity ion concentration distribution.

Further, the effects achieved in a case where the selective etching is carried out by using the dry etching based on the RIE and the succeeding wet etching will be described in detail with reference to FIG. 24 and the followings in association with an impurity concentration to an etching rate. In FIG. 24, a broken line curve 31 indicates a concentration distribution of an impurity in the polycrystalline semiconductor layer in a case where $BF_2^+$ ion of $5 \times 10^{15}$ dose was implanted into the polycrystalline silicon layer 26 at an acceleration of 60 keV. In this case, the depth indicative of the peak value of the concentration, or Rp (projection range) is about 440 Å. Referring to the figure, a solid line curve 32 indicates a like concentration distribution of an impurity in the polycrystalline silicon layer in a case where $B^+$ ion of $5 \times 10^{15}$ dose was ion-implanted into the polycrystalline silicon layer 26 at an acceleration of 30 keV. In this case, the projection range Rp indicative of the peak value of the concentration became about 1000 Å. The etching rates of the crystallographic wet etching for the polycrystalline silicon layers exhibiting the concentration distributions 31 and 32 are, as shown by a broken line curve 41 and a solid line curve 42 in FIG. 25, respectively, almost zero in the portions having high concentration distributions but become suddenly high in the portions having low concentration distributions. As mentioned above, the ion implantation concentration and the etching rate considerably depend on each other in the polycrystalline silicon layer. Accordingly, when the ion is implanted into the polycrystalline silicon layer 26 with the concentration distribution of the thickness direction as shown by the curve 31 in FIG. 24, if the dry etching is carried out to the depth d as shown by a one-dot chain line in FIG. 24 and then the succeeding wet etching is carried out, the etching is carried out in the portion of low impurity concentration so that the etching can be carried out sufficiently at high etching rate. However, when, on the other hand, the ion is implanted into the polycrystalline silicon layer with the concentration distribution as shown by the curve 32 in FIG. 24, even if the dry etching is carried out to have the depth d as shown in FIG. 24 and then the wet etching is similarly carried out, the etching is difficult to proceed. Therefore, in the case where the process as shown in FIGS. 22 and 23 is employed, the impurity concentration distribution and the depth d of the dry etching must be selected so as to become correlative with each other. In this connection, in the case where the impurity concentration is not lower than $10^{19}$ atoms/cm$^3$, when the impurity ions are B$^+$ and BF$_2^+$, the etching rate of the crystallographic wet etching becomes lower than 50 Å/minute. When the impurity ion is As$^+$, the etching rate is 500 Å/minute, when the impurity ion is P$^+$, the etching rate is 600 Å/minute and when the impurity is ion Si$^+$, the etching rate is 400 Å/minute. When the impurity concentration is not higher than $10^{17}$ atoms/cm$^3$, the etching rates become high, respectively and when a polycrystalline silicon contains almost no impurity, the etching rate is about 1500 Å/minute. When the like concentration is not lower than $10^{20}$ atoms/cm$^3$, the etching rate becomes minimum.

Figure 26:
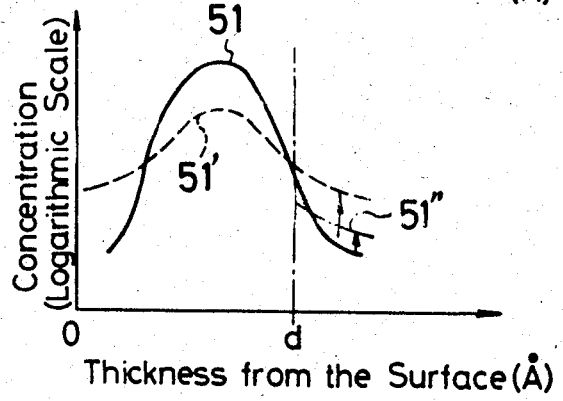
FIG. 26 is a graph of a concentration distribution useful for explaining the manufacturing method of this invention.

Further, after the afore-said dry etching but prior to the succeeding wet etching, if the annealing is carried out, the side etching can be suppressed more. That is, when the impurity is ion-implanted into the polycrystalline silicon layer with a concentration distribution shown by a solid line curve 51 in FIG. 26, if, at that time, the polycrystalline silicon layer is subjected to the annealing, or the annealing after the ion implantation, the impurity at the peak portion is diffused to thereby present a moderate characteristic as shown by a broken line curve 51' in the figure. However, when the polycrystalline silicon layer having such concentration distribution 51 is removed from the surface to the position of the depth d in FIG. 26 by the dry etching, for example, the RIE and then subjected to the annealing, the change of the cencentration distribution is such one in the portion of low concentration where the portion of high concentration is removed so that such change is as small as shown by a curve 51''. Accordingly, when, as shown in FIG. 22, the polycrystalline silicon layer 26 is subjected to the dry etching to the depth larger than the depth of the projection range Rp indicative of the peak value of the impurity ion, the concentration distribution in the bottom portion of the groove treated by the dry etching exhibits low concentration as shown by the curve 51'' in FIG. 26. On the other hand, since in the other portion the portion of high concentration is not removed by the dry etching, that portion exhibits higher concentration as shown by the broken line 51' than that of the curve 51''. In consequence, when the crystallographic wet etching is carried out thereafter, the etching rate becomes large in the groove of low impurity concentration, or the portion under the window 7a, while the etching rate becomes low in other portions as compared therewith so that without causing the side etching substantially, the etching with the pattern identical with the window 7a is carried out in the polycrystalline silicon layer 26.

In this case, when the ion implantation is selected to be not lower than $10^{19}$ atoms/cm$^3$, its etching rate is lowered rapidly as mentioned before. For this reason, it is desired to select the ion implantation condition such that after the annealing, the concentration in other portion than the portion with the groove formed by the dry etching exceed $10^{19}$ atoms/cm$^3$. If the concentration is selected as mentioned above, the resistivity of the aforementioned polycrystalline silicon layer can be made low enough to be used as a part of, for example, the base electrode.

As described above, by a series of processes of the dry etching, the annealing and the wet etching in this order, the selectively fined pattern can be formed on the polycrystalline silicon layer 26 by the etching in fined degree.

While in the above-described embodiment the selective etching on the polycrystalline silicon layer is described, the above etching can be applied to manufacturing methods accompanied with an etching process of other polycrustalline or amorphous semiconductor layer with the similar effects being achieved.

While in the above-described embodiment the present invention is applied to the method for manufacturing the NPN-type bipolar transistor, the present invention can be applied to a case in which various discrete semiconductor devices or various semiconductor integrated circuit devices such as a high or large integrated circuit and so on are obtained.

As described above, according to the present invention, since the side etching can be controlled arbitrarily by the application of the concentration distribution determined by the ion implantation of impurity and the combination with the dry etching, the fined pattern of the polycrystalline or amorphous semiconductor layer can be formed as desired. Thus, it is possible to obtain the semiconductor device of high reliability and a high or large integration of, for example, the semiconductor integrated circuit can be attained.

Further, in the manufacturing method of this invention, after the polycrystalline or amorphous semiconductor layer is formed, the impurity is ion-implanted thereto. Accordingly, if the concentration pattern of the ion implantation is selected, when the resistance element is formed by the polycrystalline silicon layer in, for example, the semiconductor integrated circuit and so on, the resistivity of this portion can be increased so that the pattern of the resistance element can be made small, increasing the high or large integrated degree of the integrated circuit.

As set forth above, when the crystallographic etching is applied, the surface of the polycrystalline or amorphous semiconductor layer where the portion is removed by etching can be formed as the smooth surface so that it is possible to obtain the semiconductor device of good stability, high reliability and good reproducibility.

We claim:

1. A method for manufacturing a semiconductor device including an etching process for selectively removing a semiconductor layer formed on a substrate, said method comprising the steps of implanting into said semiconductor layer an impurity with etching-resistant property relative to an isotropic etching of said semiconductor layer, anisotropic-etching away a region of said semiconductor layer to be selectively etched away with its portion in its thickness direction being remained, and removing said remained portion in said thickness direction of said semiconductor layer by the isotropic etching.

2. A method for manufacturing a semiconductor device including an etching process for selectively removing a semiconductor layer formed on a substrate, said method comprising the steps of implanting into said semiconductor layer an impurity with etching-resistant property relative to an isotropic etching of said semiconductor layer, anisotropic etching away a region of said semiconductor layer to be selectively etched away with its portion in its thickness direction, being remained diffusing said impurity into a region of said semiconductor layer which is not etched away by annealing, and removing said remained portion in said thickness direction of said semiconductor layer by the isotropic etching.

* * * * *